(12) United States Patent
Shinjo et al.

(10) Patent No.: US 8,016,973 B2
(45) Date of Patent: Sep. 13, 2011

(54) FILM BONDING METHOD, FILM BONDING APPARATUS, AND SEMICONDUCTOR DEVICE MANUFACTURING METHOD

(75) Inventors: Yoshiaki Shinjo, Kawasaki (JP); Yuzo Shimobeppu, Kawasaki (JP); Kazuo Teshirogi, Kawasaki (JP); Kazuhiro Yoshimoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1011 days.

(21) Appl. No.: 11/475,998

(22) Filed: Jun. 28, 2006

(65) Prior Publication Data
US 2007/0196588 A1    Aug. 23, 2007

(30) Foreign Application Priority Data
Feb. 20, 2006    (JP) ................................ 2006-042135

(51) Int. Cl.
*B29C 65/16*    (2006.01)
(52) U.S. Cl. .................................................. 156/272.8
(58) Field of Classification Search ............... 156/272.2, 156/272.8
See application file for complete search history.

(56) References Cited

U.S. PATENT DOCUMENTS

| | | | | |
|---|---|---|---|---|
| 4,933,042 A | * | 6/1990 | Eichelberger et al. | 156/239 |
| 6,210,507 B1 | * | 4/2001 | Hansen et al. | 156/109 |
| 6,380,511 B1 | * | 4/2002 | Santhanam | 219/121.64 |
| 6,394,158 B1 | * | 5/2002 | Momeni | 156/272.8 |
| 6,417,481 B2 | * | 7/2002 | Chen et al. | 219/121.6 |
| 6,478,906 B1 | * | 11/2002 | Azdasht et al. | 156/73.1 |
| 6,486,433 B2 | * | 11/2002 | Grewell et al. | 219/121.63 |

FOREIGN PATENT DOCUMENTS
JP    2004-153193 A    5/2004
JP    2004-186240 A    7/2004

* cited by examiner

*Primary Examiner* — Richard Crispino
*Assistant Examiner* — Daniel McNally
(74) *Attorney, Agent, or Firm* — Fujitsu Patent Center

(57) ABSTRACT

A film bonding method of bonding a die bond film without causing any breakage. The die bond film is pressed against a wafer having a surface protective tape bonded thereto using a film-setting roller and a film-bonding roller, and a laser beam having a predetermined shape is irradiated to an area between the rollers. While rotationally moving the film-setting roller and the film-bonding roller, the laser beam is scanned on the wafer in accordance with their motion, and a portion of the die bond film, melted by the laser beam, is pressed against the wafer by the film-bonding roller following the film-setting roller to bond the die bond film to the wafer. Since the die bond film is bonded to the wafer by melting the same by the laser beam, even if the wafer is thin and reduced in its strength, it is possible to avoid the wafer from being damaged e.g. by thermal contraction of the surface protective tape.

5 Claims, 20 Drawing Sheets

FILM BONDING METHOD, FILM BONDING APPARATUS, AND SEMICONDUCTOR DEVICE MANUFACTURING METHOD

CROSS-REFERENCE TO RELATED APPLICATIONS

This application is based upon and claims the benefits of priority from the prior Japanese Patent Application No. 2006-042135, filed on Feb. 20, 2006, the entire contents of which are incorporated herein by reference.

BACKGROUND OF THE INVENTION

1. Field of the Invention

This invention relates to a film bonding method, a film bonding apparatus, and a semiconductor device manufacturing method, and more particularly to a film bonding method and a film bonding apparatus for use in bonding a die bond film to a semiconductor substrate (wafer), and a semiconductor device manufacturing method including a step of bonding a die bond film.

2. Description of the Related Art

In the manufacture of a semiconductor IC (Integrated Circuit), normally, first, a surface (semiconductor element-forming surface) of a semiconductor substrate (wafer) subjected to a predetermined wafer process is covered with a surface protective tape, and then the back (rear) surface of the wafer is ground (back grinding process) to thereby reduce the thickness of the wafer.

After the back grinding process, the surface protective tape is peeled off the surface of the wafer, and a dicing tape is bonded to the back surface of the wafer. In this state, a singulation process is carried out on the wafer from the front surface side thereof, whereby a plurality of semiconductor elements (chips) are formed.

Then, the singulated chips are separated from the dicing tape, and a die bonding process is performed on a predetermined portion of a semiconductor element-receiving container.

Conventionally, in the die bonding process, as a method of bonding chips to a support substrate, such as a lead frame, there has been widely employed a method in which first, an adhesive is coated on the surface of the support substrate, and then a chip is secured to the support substrate using the adhesive.

In recent years, however, a method is also used in which an adhesive film (die bond film) for securing semiconductor elements is bonded to the back surface of a wafer subjected to a back grinding process, and then the wafer is singulated.

According to this method, a singulated chip can be secured to a support substrate via a die bond film which is small and uniform in thickness and is bonded to the back surfaces of the chip, and therefore it is possible not only to secure the chip to a predetermined position with accuracy but also to further reduce the thickness (height) of the chip.

The above-described die bond film includes die bond films which have adhesive properties at normal temperature, or thermoplastic die bond films which exhibit adhesive properties when heated. The thermoplastic die bond films are advantageous in that they are easy to handle during the manufacturing process.

FIG. 20 shows a conventional method of bonding a thermoplastic die bond film to a wafer.

In bonding a thermoplastic die bond film 100 to the back surface of a wafer 101, a bonding method is employed in which the wafer is heated from a surface thereof opposite to a surface (back surface) where the die bond film 100 is bonded, that is, from a front surface (semiconductor element-forming surface) of the wafer, and in this state, the die bond film 100 is pressed against the back surface (bonding surface) of the wafer by a rubber roller 103.

There is also proposed another method of bonding a thermoplastic die bond film, in which the die bond film is progressively bonded without heating the whole surface of the wafer but by heating only part of the surface where bonding is being performed.

For example, there have been proposed a method in which a die bond film is bonded to a wafer using a roller provided with a heating mechanism, and a method in which a table including a heating and cooling mechanism is used, and after placing a wafer on the table, the heating and cooling of the table is partially controlled depending on the position of a roller for pressing a die bond film toward the wafer (see Japanese Unexamined Patent Publication No. 2004-186240).

Recently, it is necessary to make wafers even thinner in accordance with an increasing demand for further reduction of the size and thickness of semiconductor devices, and accordingly, there is an increasing demand for making the thickness of wafers not larger than 100 mµ.

As described above, generally, wafers are processed to a small thickness by back grinding after forming semiconductor elements. It is natural, however, that a thin wafer is low in strength and hence easy to crack.

In contrast, for example, an attempt is being made to avoid breakage of a thinned wafer by placing the wafer on a protective substrate having a small hole formed in the center thereof, and performing a grinding process or transfer of the wafer while fixedly sucking the wafer via the small hole (see Japanese Unexamined Patent Publication No. 2004-153193).

When the conventional die bond film-bonding method in general use is employed, that is, the method of performing back grinding of the back surface of a semiconductor substrate (wafer) after bonding a surface protective tape to the main surface of the wafer, and then bonding a die bond film to the back surface of the wafer while heating the whole surface of the wafer is employed, relatively large thermal expansion or thermal contraction occurs on the surface protective tape.

As a result, it is impossible for a thinned wafer having a thickness of approximately 100 mµ or less to bear such thermal deformation of the surface protective tape. This leads to cracking of the wafer.

SUMMARY OF THE INVENTION

The present invention has been made in view of the above points, and a first object thereof is to provide a film bonding method which is capable of bonding a film, such as a die bond film, to the back surface of a wafer, without causing thermal deformation of a surface protective tape, and therefore without causing any breakage of the wafer, and a film bonding apparatus implementing the bonding method.

A second object of the present invention is to provide a semiconductor device manufacturing method which is capable of avoiding breakage of a wafer when a film, such as a die bond film, is bonded thereto.

To attain the above first object, in a first aspect of the present invention, there is provided a film bonding method comprising the steps of disposing a film on a to-be-processed substrate, selectively irradiating a laser beam onto the film to thereby selectively melt the film, pressing a portion of the film in a melted state against the to-be-processed substrate to thereby bond the film to the to-be-processed substrate.

To attain the above first object, in a second aspect of the present invention, there is provided a film bonding apparatus comprising a pressing unit which presses a film disposed on a to-be-processed substrate against the to-be-processed substrate, an irradiating unit which selectively irradiates a laser beam onto the film pressed against the to-be-processed substrate, and a pressing unit which presses the film irradiated with the laser beam against the to-be-processed substrate.

To attain the above second object, in a third aspect of the present invention, there is provided a semiconductor device manufacturing method comprising the steps of forming a plurality of semiconductor elements on one main surface of a semiconductor substrate, bonding a surface protective tape to the one main surface of the semiconductor substrate, decreasing a thickness of the semiconductor substrate by grinding the other main surface of the semiconductor substrate, coating a die bond film on the other main surface of the semiconductor substrate, eliminating the surface protective tape from the one main surface of the semiconductor substrate, singulating the plurality of semiconductor elements by cutting and separating the semiconductor substrate, wherein the step of bonding the die bond film to the other main surface of the semiconductor substrate includes a step of selectively irradiating a laser beam onto the die bond film disposed on the semiconductor substrate to heat the die bond film to thereby bond the heated portion to the semiconductor substrate.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

The present invention will now be described in detail with reference to the accompanying drawings showing preferred embodiments thereof. In the embodiments, a semiconductor substrate (wafer) is used as a to-be-processed substrate, and a die bond film is bonded to the wafer, by way of example.

First of all, a description will be given of a first embodiment of the present invention.

Figure 1:
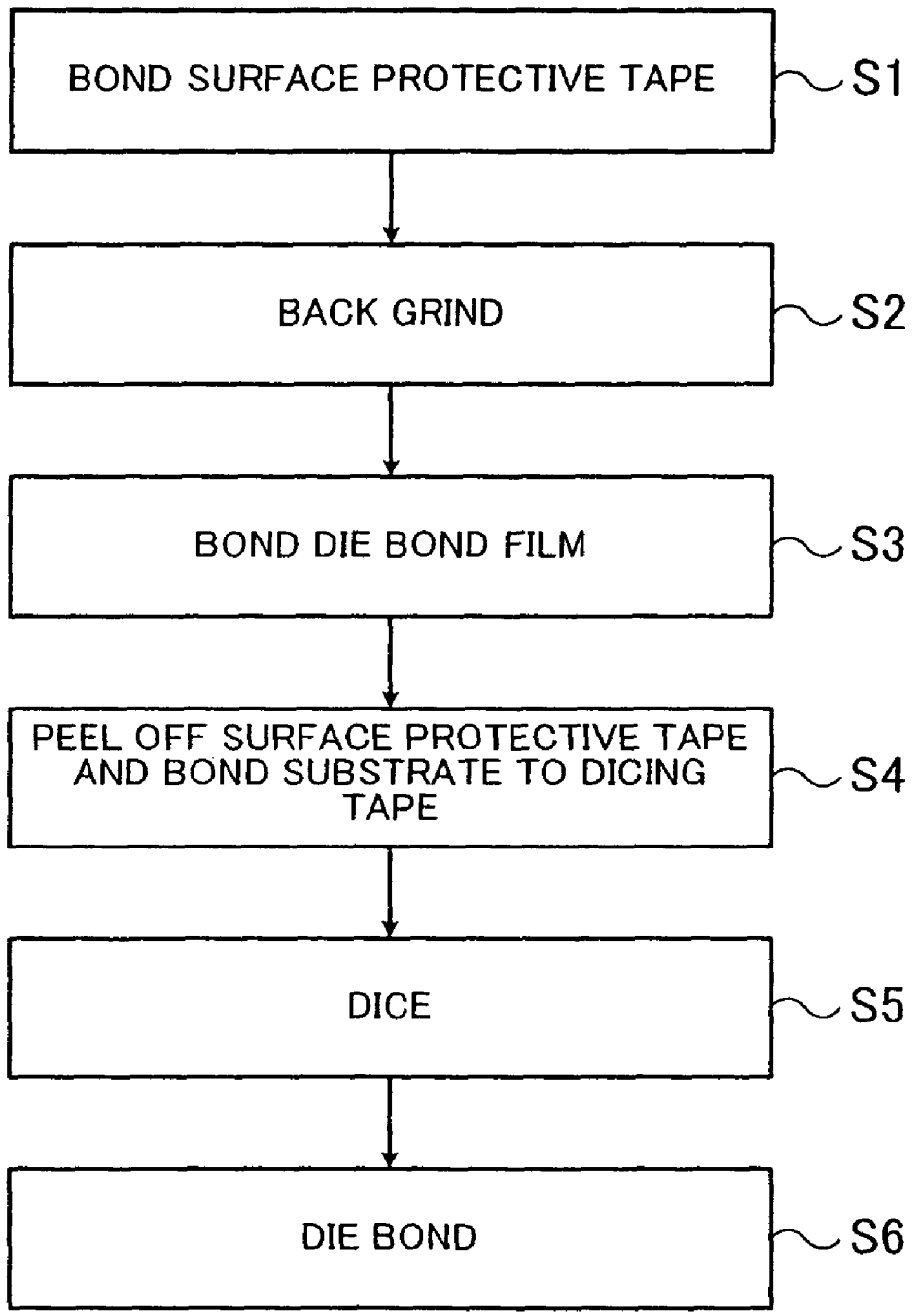
FIG. 1 is a diagram showing a flow of process steps of manufacturing a semiconductor device, according to a first embodiment of the present invention.

FIG. 1 shows a flow of steps of a process for manufacturing a semiconductor device, according to the first embodiment. The process steps shown in FIG. 1 are executed after the semiconductor elements have been formed on the to-be-processed semiconductor substrate (wafer).

Figure 2:
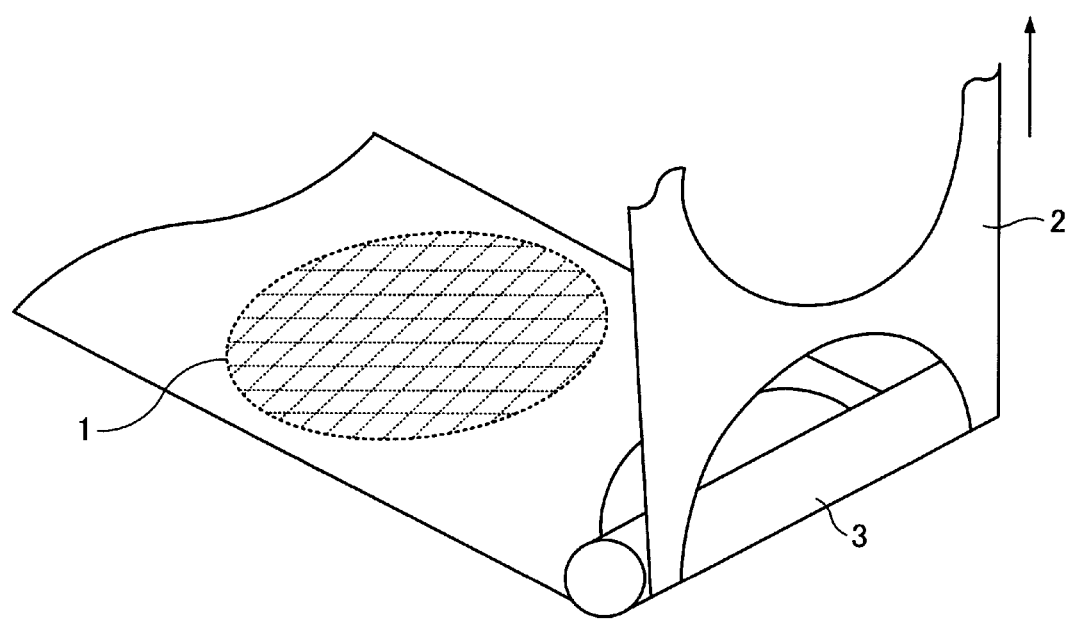
FIG. 2 is a diagram illustrating a surface protective tape-bonding process step.
Figure 3:
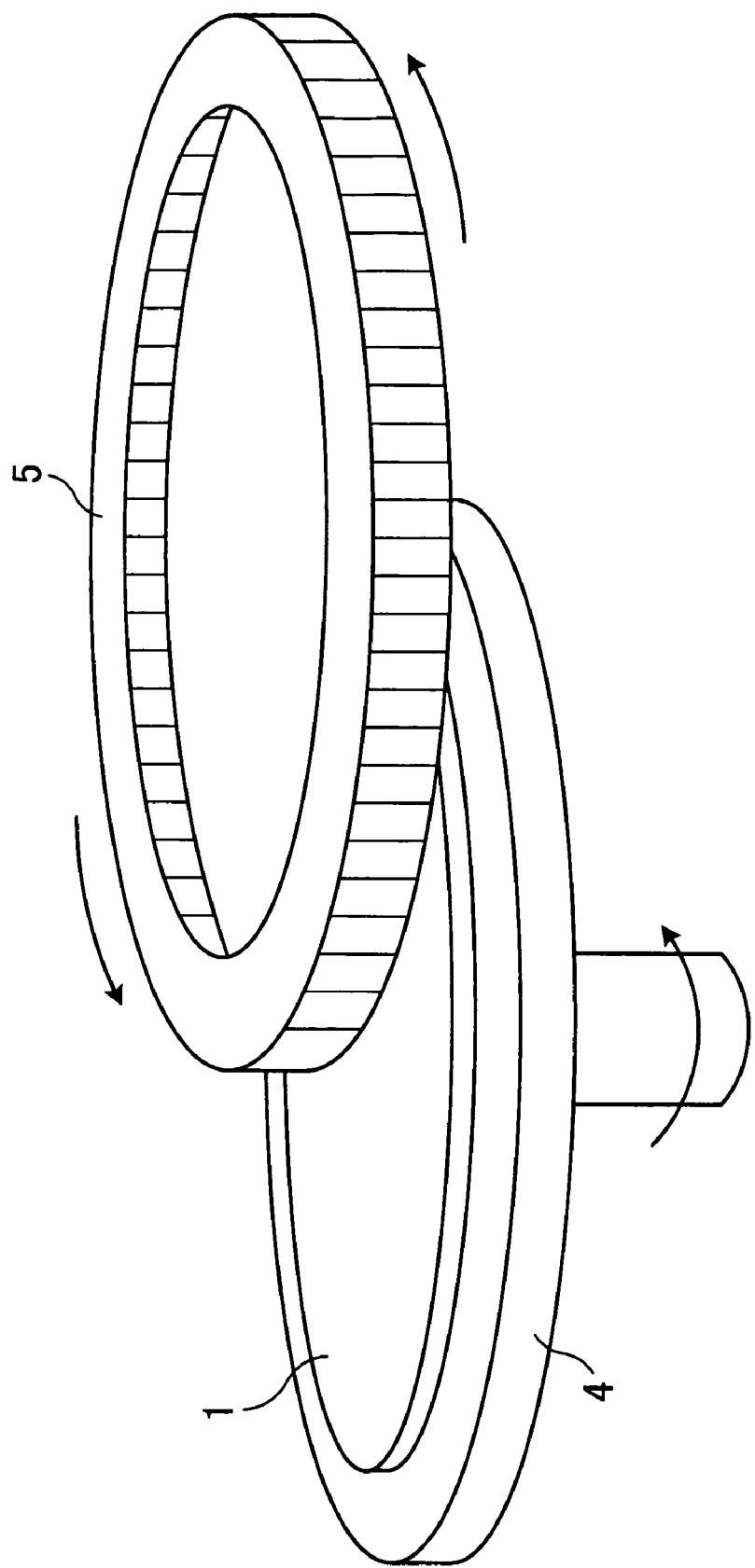
FIG. 3 is a diagram illustrating a back-grinding process step.
Figure 4:
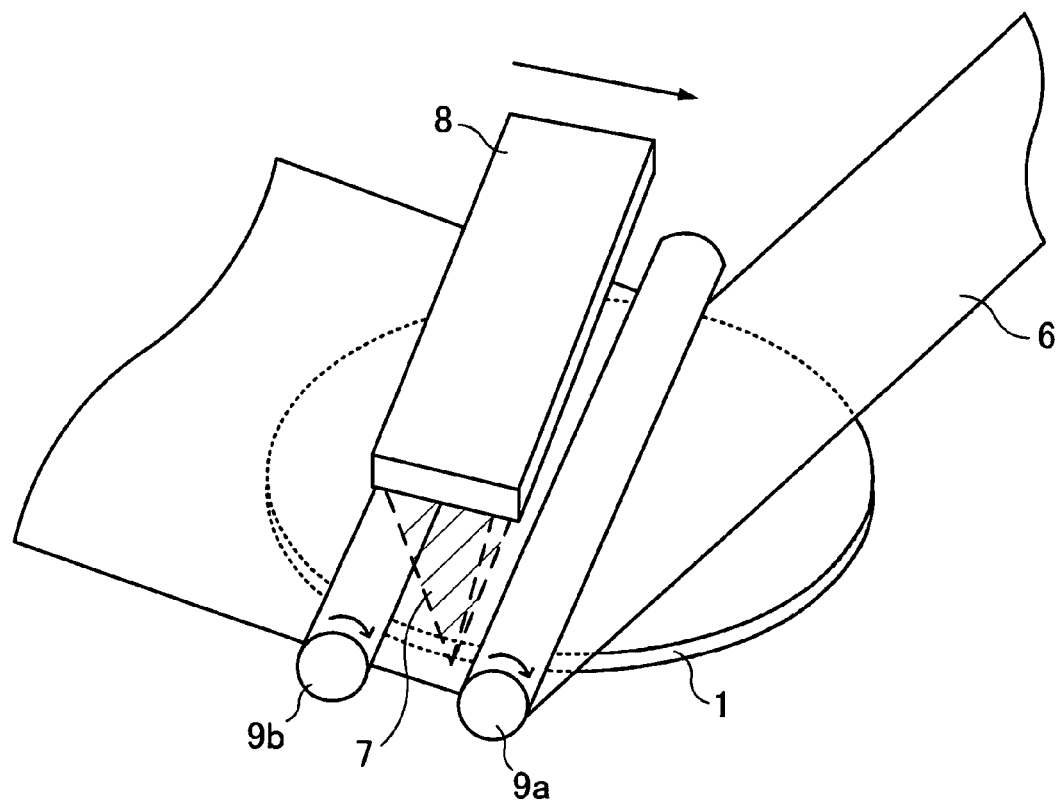
FIG. 4 is a diagram illustrating a die bond film-bonding process step.
Figure 5:
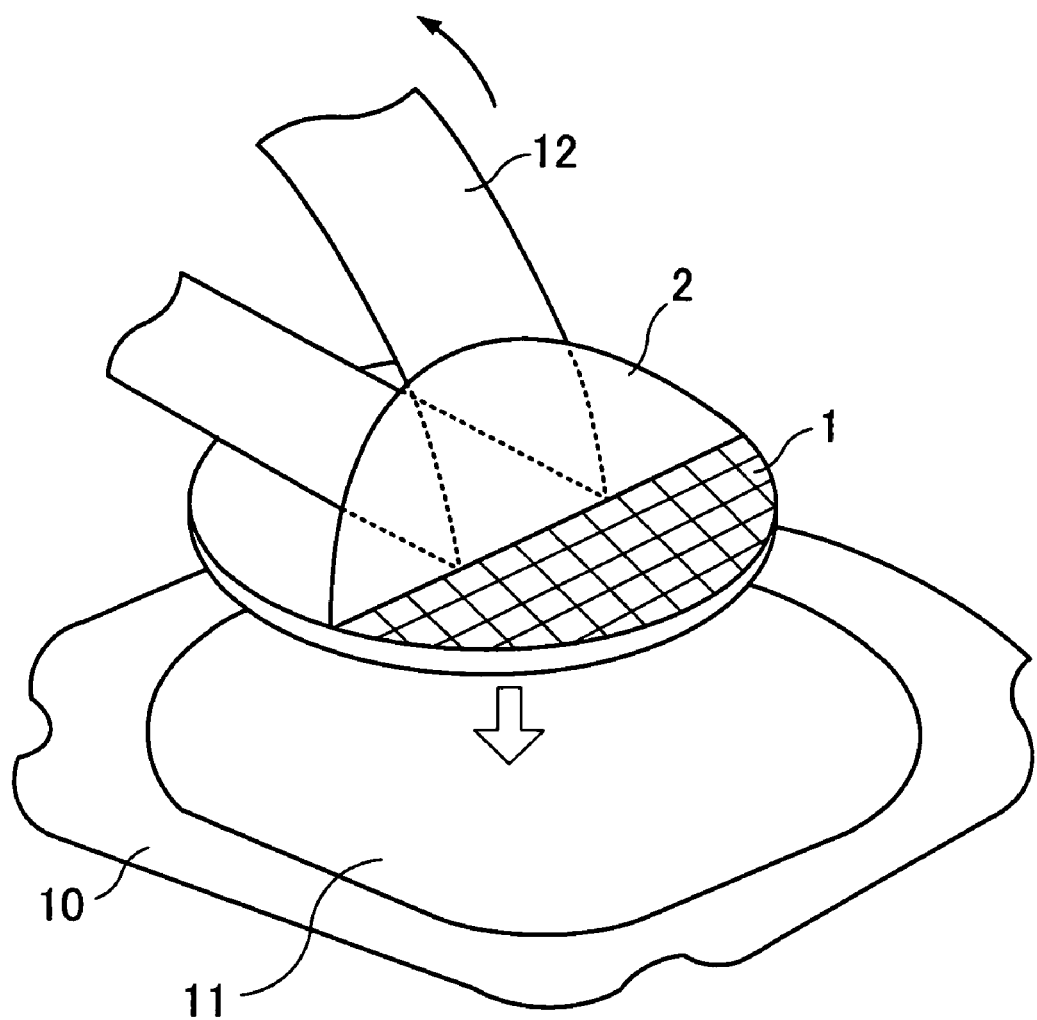
FIG. 5 is a diagram illustrating a surface protective tape-peeling process step and a dicing tape-bonding process step.
Figure 6:
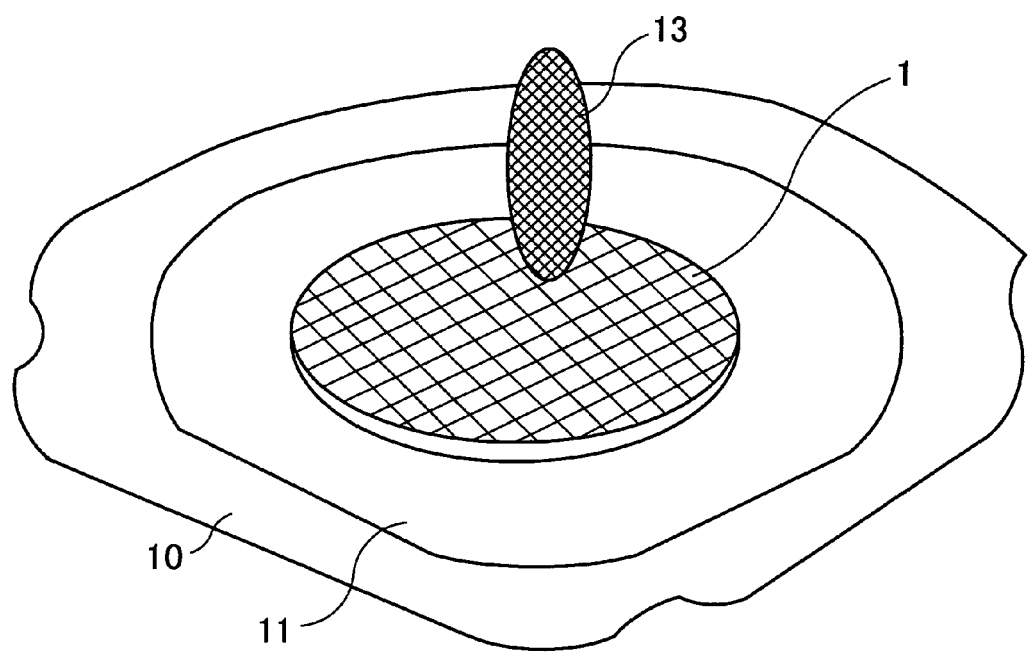
FIG. 6 is a diagram illustrating a dicing process step.
Figure 7:
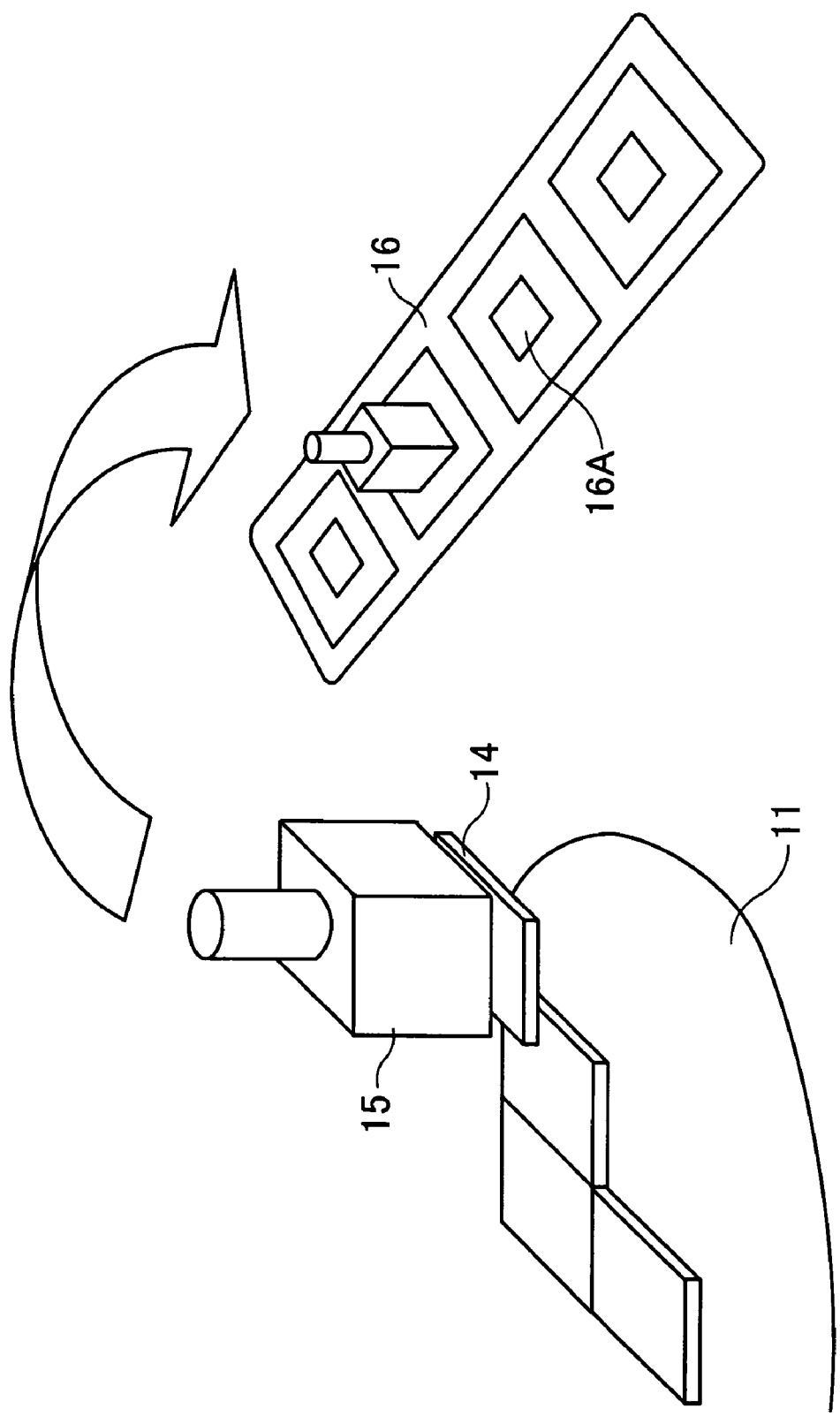
FIG. 7 is a diagram illustrating a die bonding process step.

Further, FIGS. 2 to 7 are schematic diagrams illustrating the respective process steps of manufacturing the semiconductor device, appearing in FIG. 1. FIG. 2 shows a surface protective tape-bonding process step, and FIG. 3 shows a back-grinding process step. Further, FIG. 4 shows a die bond film-bonding process step, and FIG. 5 shows a surface protective tape-peeling process step and a dicing tape-bonding process step. Further, FIG. 6 shows a dicing process step, and FIG. 7 shows a die bonding process step.

A plurality of semiconductor elements (devices) are formed on a surface (one main surface) of the wafer 1 after executing a wafer process (pre-process) which is required for forming the semiconductor elements, and then as shown in FIG. 2, a surface protective tape 2 made of an olefin-based material or PET (Poly Ethylene Terephthalate) is bonded to the surface (device-forming surface) of the wafer 1 using a roller 3 (FIG. 1: step S1).

The surface protective tape 2 has a belt-like portion. After being bonded, the surface protective tape 2 is cut off along the outer shape of the wafer 1, whereby the bonded portion of the surface protective tape 2 is separated from the belt-like portion thereof.

Then, a back grinding process for grinding the back surface of the wafer 1 is performed (FIG. 1: step S2).

As shown in FIG. 3, in the back grinding process, the wafer 1 is set on a rotary table 4 with the back surface thereof facing upward, and the back surface of the wafer 1 is ground by a rotating grinding wheel 5 while rotating the rotary table 4.

Subsequently, as shown in FIG. 4, a die bond film 6 is bonded to the back surface of the to-be-processed wafer 1 (FIG. 1: step S3). The die bond film 6 is made of a polyimide resin or a epoxy resin, and has a film thickness thereof set to be approximately 15 µm, for example.

According to the present embodiment, in the die bond film-bonding process step, rollers are used as means for pressing the die bond film 6 against the back surface of the wafer 1, and a laser beam 7 is used as heating means (heat source).

More specifically, the die bond film 6 having a belt-like shape in a state disposed on the back surface of the wafer 1 is pressed against the back surface of the wafer 1 by a film-setting roller 9a and a film-bonding roller 9b, which are rotatable and arranged in spaced relation parallel to each other.

The film-setting roller 9a and the film-bonding roller 9b have elastic surfaces made e.g. of rubber, and these elastic parts have a size corresponding to the width of the die bond film 6.

On the other hand, the laser beam 7 is adjusted by a laser optical system including a lens system, such that the shape of the laser beam irradiated on the surface of the wafer 7 is rectangular, and irradiated to an area which extends between the film-setting roller 9a and the film-bonding roller 9b, in parallel with the rollers 9a and 9b.

The die bond film 6 pressed onto the wafer 1 by the film-setting roller 9a is melted by irradiation with the laser beam 7, and a portion irradiated and melted by the irradiation is pressed against the back surface of the wafer 1 by the film-bonding roller 9b whereby the die bond film 6 is bonded to the back surface of the wafer 1.

As described above, when the die bond film 6 is bonded to the wafer 1, heat energy is locally and selectively given to the die bond film 6 using the laser beam 7 as the heating means, whereby it is possible to locally and selectively melt the die bond film 6.

Therefore, compared with the case where the whole surface of the wafer is heated e.g. by a heater as in the conventional method, it is possible to inhibit a rise in the temperature of the wafer to thereby avoid occurrence of thermal deformation, such as thermal expansion or thermal contraction, of the surface protective tape 2.

The die bond film 6 bonded to the back surface of the wafer 1 is cut off along the outer shape of the wafer 1, whereby the bonded portion of the film 6 is separated from the belt-like portion of the same.

After the die bond film 6 is bonded to the back surface of the wafer 1, the surface protective tape 2 is peeled off the front surface of the wafer 1, as shown in FIG. 5, and the back surface of the wafer 1 is bonded to a dicing tape 11 on a tape frame 10 (FIG. 1: step S4).

It should be noted that the dicing tape 11 has an adhesive property, and the wafer 1 is fixed to the dicing tape 11 together with the die bond film 6 bonded to the back surface of the wafer 1.

Further, reference numeral 12 designates a tape-removing tape for use in removing or peeling off the surface protective tape 2 from the front surface of the wafer 1. After the tape-removing tape 12 is bonded to the surface protective tape 2 e.g. by a roller (not shown), the tape-removing tape 12 is pulled to thereby peel off the surface protective tape 2 from the front surface of the wafer 1.

Then, as shown in FIG. 6, a wafer-dicing process for dicing the wafer 1 is performed using a dicing blade 13 to thereby singulate the plurality of semiconductor devices formed on the wafer 1 (FIG. 1: step S5).

Thereafter, as shown in FIG. 7, each non-defective one of the singulated semiconductor elements 14 is picked up by a chuck 15, and transferred onto an island portion 16A of a support substrate 16, such as a lead frame.

It should be noted that when the semiconductor element 14 is picked up, the dicing tape 11 has the adhesive force thereof reduced by heat or irradiation with ultraviolet rays.

The die bond film 6 bonded to the back surface of the wafer 1 is melted, pressurized, and cured on the island portion 16A of the support substrate 16, whereby the semiconductor element 14 is secured to the island portion 16A (FIG. 1: step S6).

As described above, after forming the devices (semiconductor elements), the process steps up to the die bonding process step are thus carried out.

Now, a more detailed description will be given of the method of bonding the die bond film 6 using the laser beam, described above in the step S3.

Figure 8:
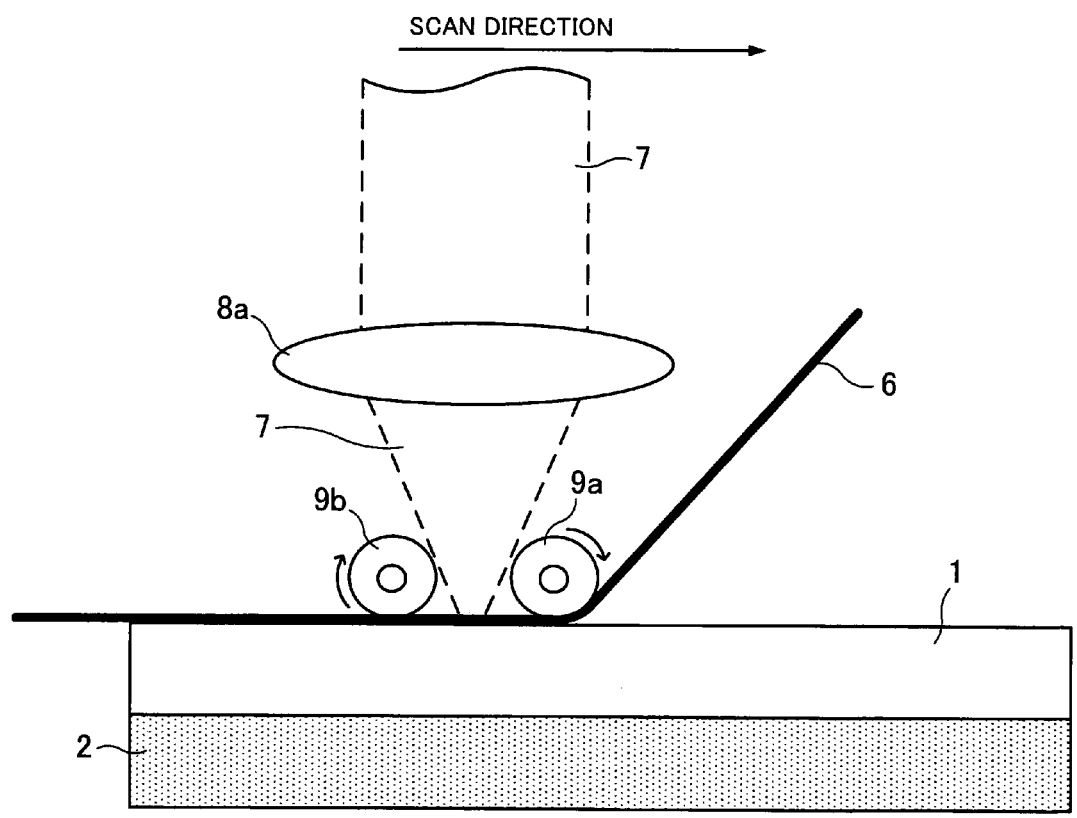
FIG. 8 is a diagram illustrating a method of bonding the die bond film, according to the first embodiment.

FIG. 8 illustrates the method of bonding the die bond film according to the first embodiment.

As described hereinabove, the surface protective tape 2 is bonded to the device-forming surface of the wafer 1, and the die bond film 6 is bonded to the back surface of the wafer 1 which has been subjected to the back grinding process.

At least an area of the die bond film 6 between the film-setting roller 9a and the film-bonding roller 9b, which are arranged parallel with each other, is pressed against the back surface of the wafer 1 by the rollers 9a and 9b.

Then, the laser beam 7 adjusted to have a predetermined, e.g. rectangular shape is irradiated via a lens 8a onto the die bond film 6 located in the area between the film-setting roller 9a and the film-bonding roller 9b.

While rotationally moving the film-setting roller 9a and the film-bonding roller 9b relative to the wafer 1, and the laser beam 7 is moved in accordance with the motion of the rollers 9a and 9b.

Figure 9:
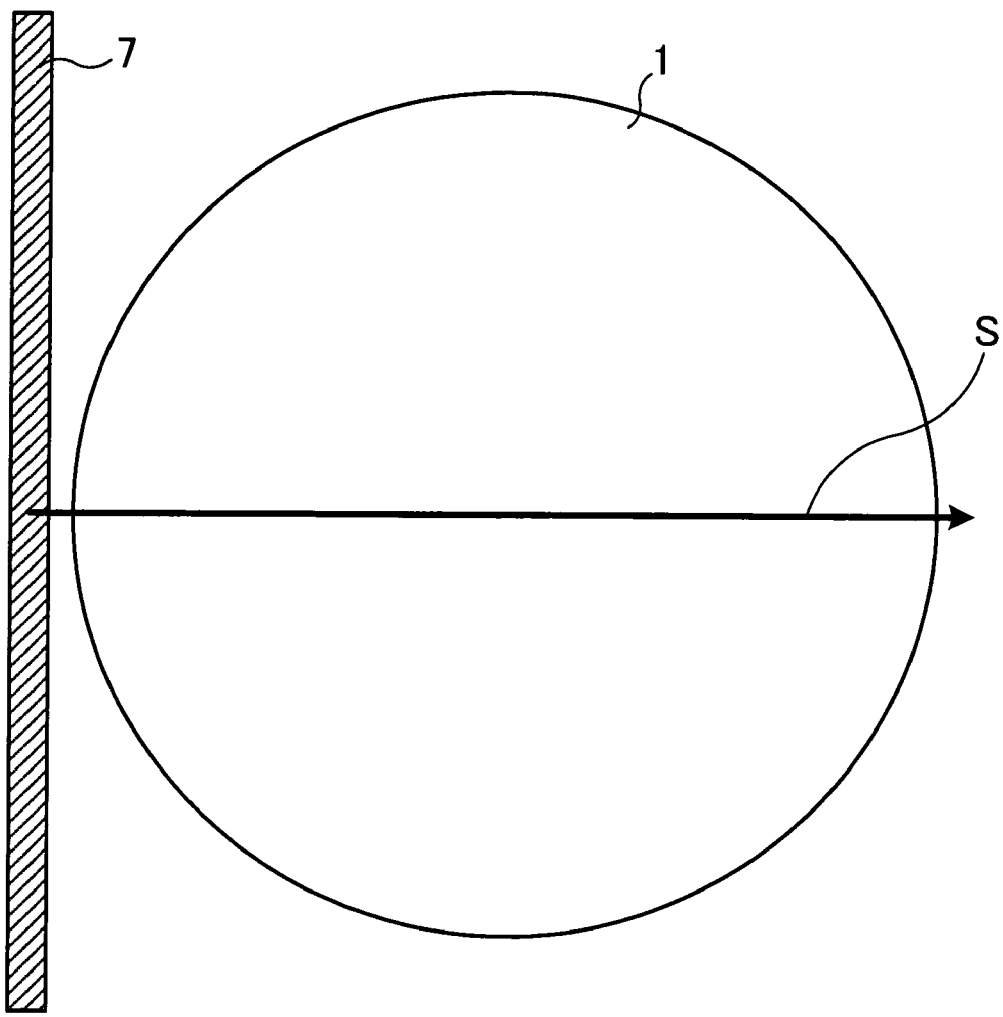
FIG. 9 is a diagram illustrating an example of a laser scanning method.

FIG. 9 illustrates an example of a laser scanning method according to the present embodiment of the present invention.

When the laser beam formed into an rectangular shape is irradiated onto the die bond film 6 located on the back surface of the wafer 1, it is desirable that the width (width in the longitudinal direction, i.e. a length in a direction orthogonal to the direction of the motion of the laser beam 7) of the rectangular shape is set to a value approximately 1.1 times as long as the diameter of the wafer 1.

The laser beam 7 formed into the above-described shape is moved (scanned) from one edge, through the center, to the other edge of the wafer 1, as indicated by an arrow S shown in FIG. 9, whereby the laser beam 7 is irradiated onto the whole back surface of the wafer 1.

When the laser beam 7 is scanned as described above, the film-setting roller 9a and the film-bonding roller 9b appearing in FIG. 8 move in unison with the laser beam 7 before and after the same in the direction of the motion thereof in accordance therewith.

Figure 10:
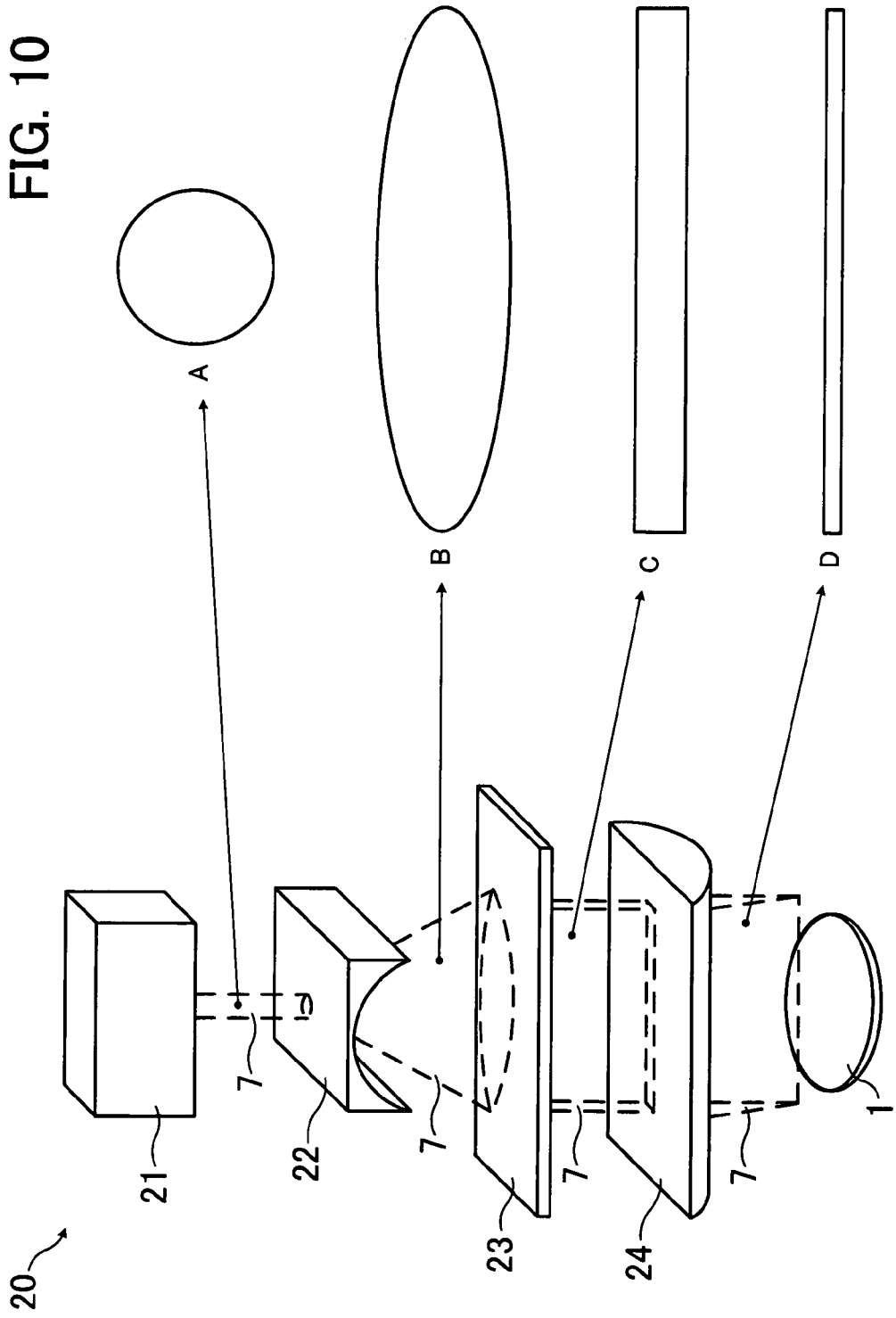
FIG. 10 is a diagram illustrating an example of a laser optical system.

The laser beam 7 formed into a generally rectangular shape as described above can be realized e.g. by a laser optical system shown in FIG. 10. FIG. 10 also illustrates shapes (A to D) of the laser beam in cross section which are formed at the essential parts of the system.

The laser optical system 20 illustrated in FIG. 10 is comprised of a laser beam oscillator 21, a cylindrical plano-concave lens 22, a linear mask 23, and a cylindrical plano-convex lens 24.

In the laser optical system 20, the laser beam 7 emitted in a circular cross-sectional shape (A) from the laser beam oscillator 21 has its shape changed into an elliptical cross-sectional shape (B) by the cylindrical plano-concave lens 22, and then into a rectangular cross-sectional shape (C) by the linear mask 23. Furthermore, the rectangular cross-sectional shape (C) of the laser beam is changed into a rectangular cross-sectional shape (D) having a narrower width by the cylindrical plano-convex lens 24.

After that, the laser beam having the rectangular cross-sectional shape (D) having the narrower width is irradiated onto the die bond film 6 located on the to-be-processed wafer 1.

Conditions for irradiating the laser beam 7 onto the die bond film 6 located on the wafer 1 are selected based on the material of the die bond film 6, the thickness of the wafer 1, the material of the surface protective tape 2, and so forth. For example, a laser beam having a wavelength of 100 to 1000 nm can be irradiated under irradiation conditions of an output of 0.1 to 100 W, and a scanning speed of 0.1 to 500 mm/s.

In doing this, the conditions are selected such that the laser beam is capable of melting the die bond film 6 while suppressing the thermal expansion and the thermal contraction of the surface protective tape 2.

When the die bond film 6 is bonded to the back surface of the wafer 1, the laser optical system 20 is used, and as shown in FIG. 8, the film-setting roller 9a is moved before the film-bonding roller 9b in a direction corresponding to the scanning direction of the laser beam 7, and the film-bonding roller 9b is moved in a manner following the film-setting roller 9a and the laser beam 7.

More specifically, while pressing the die bond film 6 against the wafer 1 using the film-setting roller 9a and the film-bonding roller 9b, the laser beam 7 is irradiated onto only an area immediately after the film-setting roller 9a to thereby melt the irradiated portion of the die bond film 6, and the melted portion is pressed against the wafer 1 by the film-bonding roller 9b moving immediately after the laser beam 7, whereby the die bond film 6 is bonded to the wafer 1.

When carried out on the whole back surface of the wafer 1, the above operation makes it is possible to bond the die bond film 6 to the wafer 1 uniformly and efficiently, while avoiding occurrence of thermal deformation, such as thermal expansion or thermal contraction, of the surface protective tape 2 bonded to the other surface of the wafer 1.

Figure 11:
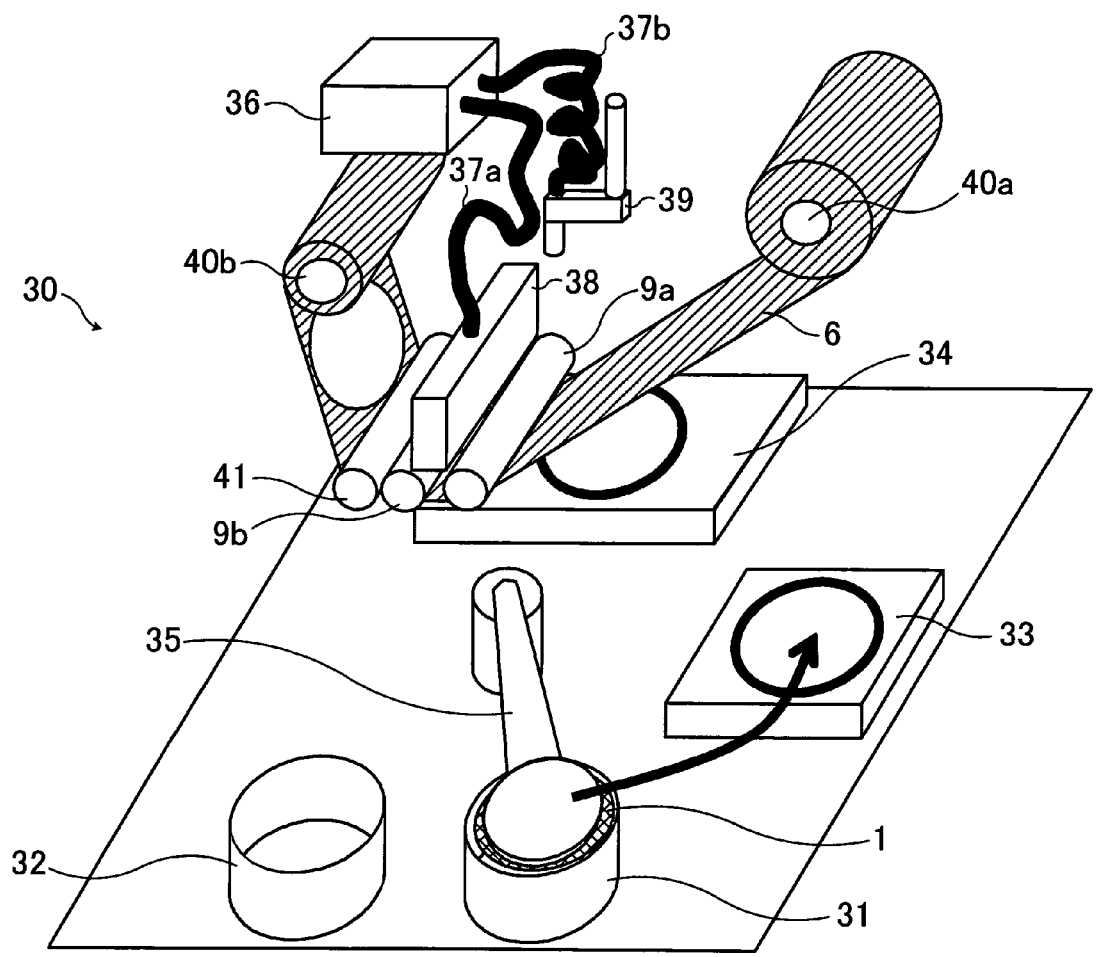
FIG. 11 is a diagram showing the arrangement of a film-bonding apparatus.

FIG. 11 shows the arrangement of a film-bonding apparatus which is applied to the film-bonding process for bonding the die bond film 6 to the wafer 1.

As shown in FIG. 11, the film-bonding apparatus 30 includes a first wafer case 31 for storing the to-be-processed wafer 1 after the back grinding process has been carried out thereon and before the die bond film 6 is bonded thereto, and a second wafer case 32 for storing the wafer 1 after the die bond film 6 is bonded thereto.

Further, the film-bonding apparatus 30 includes a wafer-centering device 33 for centering the to-be-processed wafer 1, and a film-bonding table 34 where the film-bonding process is carried out for bonding the die bond film 6 to the wafer 1.

Further, the film-bonding apparatus 30 includes a wafer transfer robot 35 for transferring a to-be-processed wafer 1 stored in the first wafer case 31 onto the wafer-centering device 33, and transferring the to-be-processed wafer 1 placed on the wafer-centering device 33 onto the film-bonding table 34, and further for transferring the wafer 1 placed on the film-bonding table 34 with the die bond film 6 bonded thereto, to the second wafer case 32 to store the wafer 1 therein.

Furthermore, the film-bonding apparatus 30 has a film-bonding laser irradiation device 38 and a film-cutting laser irradiation device 39 which are disposed in the vicinity of the film-bonding table 34 and connected to a laser oscillator 36 by optical fibers 37a and 37b, respectively.

The film-bonding laser irradiation device 38 includes a laser optical system formed by the laser oscillator 36 and a lens, and is capable of scanning the laser beam 7 formed into a predetermined shape over a predetermined area of the film-bonding table 34. On the other hand, the film-cutting laser irradiation device 39 cuts off the die bond film 6 bonded to the wafer 1 along the outer shape of the wafer 1 on the film-bonding table 34, to thereby separate the bonded portion of the die bond film 6 from the belt-like portion thereof.

A constant tension is applied to the belt-like die bond film 6 sent out from a film feed roller 40a toward a film-winding roller 40b, using the film-setting roller 9a and the film-bonding roller 9b, both of which are configured to be capable of moving on the die bond film 6 from the film-winding roller side toward the film feed roller 40a, and a film-fixing roller 41 located closest to the film-winding roller 40b.

When the to-be-processed wafer 1 is placed on the film-bonding table 34, the film-setting roller 9a and the film-bonding roller 9b move to press the die bond film 6 against the wafer 1. At this time, the film-bonding laser irradiation device 38 also moves along with the film-setting roller 9a and the film-bonding roller 9b.

Next, a method for carrying out the film-bonding process for bonding the die bond film 6 to the wafer 1, using the film-bonding apparatus 30 configured as above will be described with reference to FIGS. 11 and 12 to 16.

FIGS. 12 to 16 are schematic diagrams useful in explaining the process step of bonding the die bond film using the film-bonding apparatus.

It is assumed here that the film-bonding apparatus 30 is in a state before the die bond film 6 is bonded to the wafer, that is, in the above-described state illustrated in FIG. 11, and for convenience of description, this state is referred to as an initial state of the film-bonding apparatus 30.

When the die bond film 6 is bonded to the back surface of the wafer 1 using the film-bonding apparatus 30, as shown in FIG. 11, the wafer transfer robot 35 takes out the wafer 1 stored in the first wafer case 31 therefrom, and transfers the wafer 1 to the wafer-centering device 33.

The wafer 1 has the surface protective tape 2 bonded to the first main surface (front surface) thereof in a process step before the process step of bonding the die bond film. Further, the wafer 1 is stored in the first wafer case 31 with the back surface thereof facing upward.

The wafer transfer robot 35 takes out the wafer 1 in the above state, and transfers the wafer 1 with the back surface thereof facing upward.

The wafer-centering device 33 performs a centering process for centering the wafer 1 transferred thereto. Thanks to this centering process, it possible in a subsequent process step to align the center of the wafer 1 and the center of a tape material to be bonded to the wafer 1, in the direction of width thereof. This makes it possible to cut off the tape material along the outer shape of the wafer 1 with high accuracy such that the outer shape of the tape material agrees with that of the wafer 1.

Figure 12:
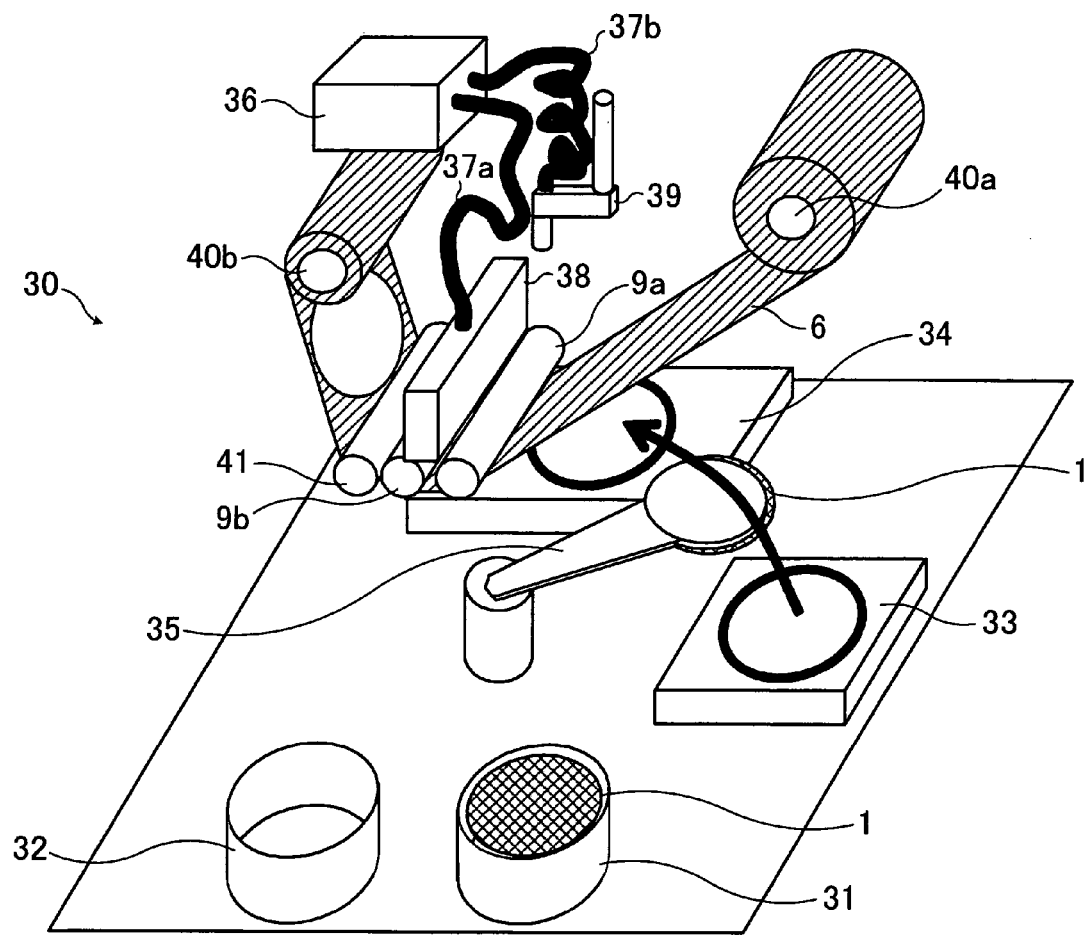
FIG. 12 is a diagram (1) schematically showing the arrangement of the film-bonding apparatus, which is useful in explaining the process step of bonding the die bond film using the film-bonding apparatus.

Then, the wafer transfer robot 35 transfers the wafer 1 having been subjected to the centering process by the wafer-centering device 33, onto the film-bonding table 34 such that the back surface of the wafer 1 faces upward when the wafer 1 is placed on the film-bonding table 34. This state of the wafer transfer robot 35 is shown in FIG. 12.

Figure 13:
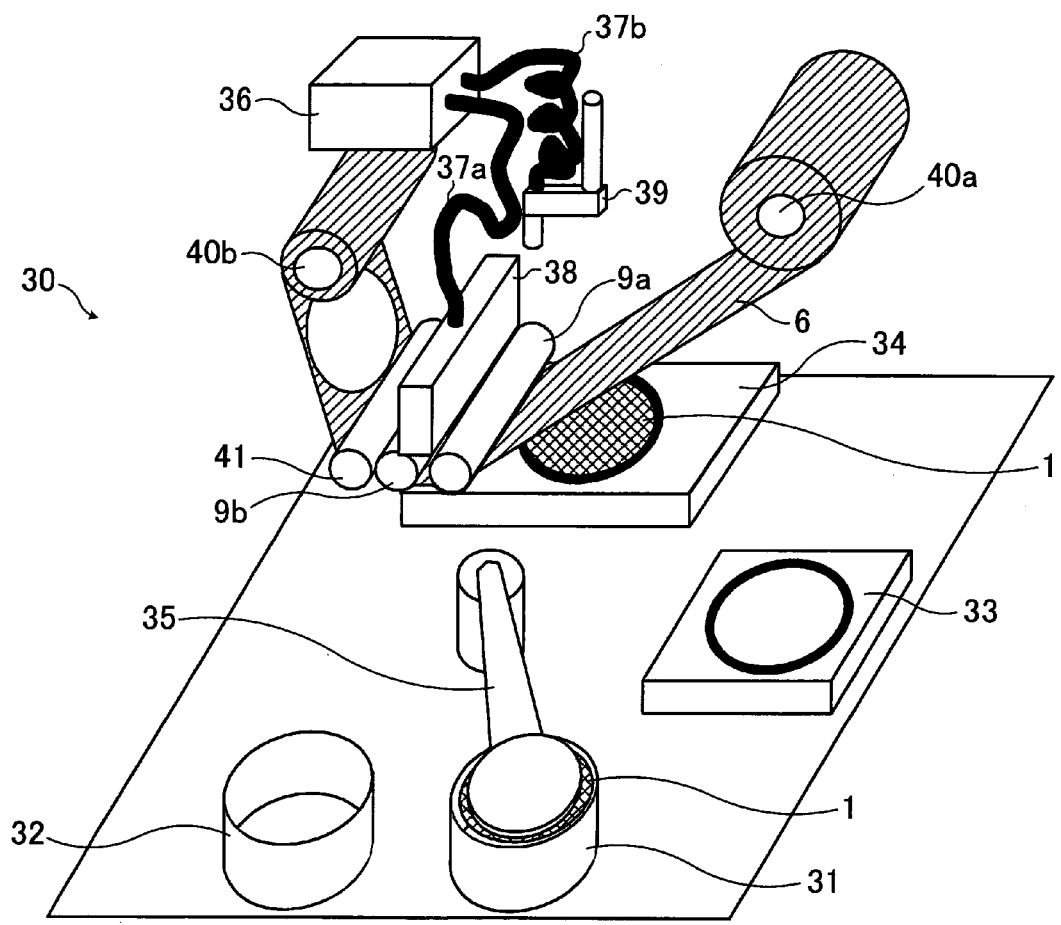
FIG. 13 is a diagram (2) schematically showing the arrangement of the film-bonding apparatus, which is useful in explaining the process step of bonding the die bond film using the film-bonding apparatus.

After that, as shown in FIG. 13, the wafer transfer robot 35 returns to the position of the first wafer case 31 again, and starts to be prepared for transfer of a next wafer 1 to be processed.

Figure 14:
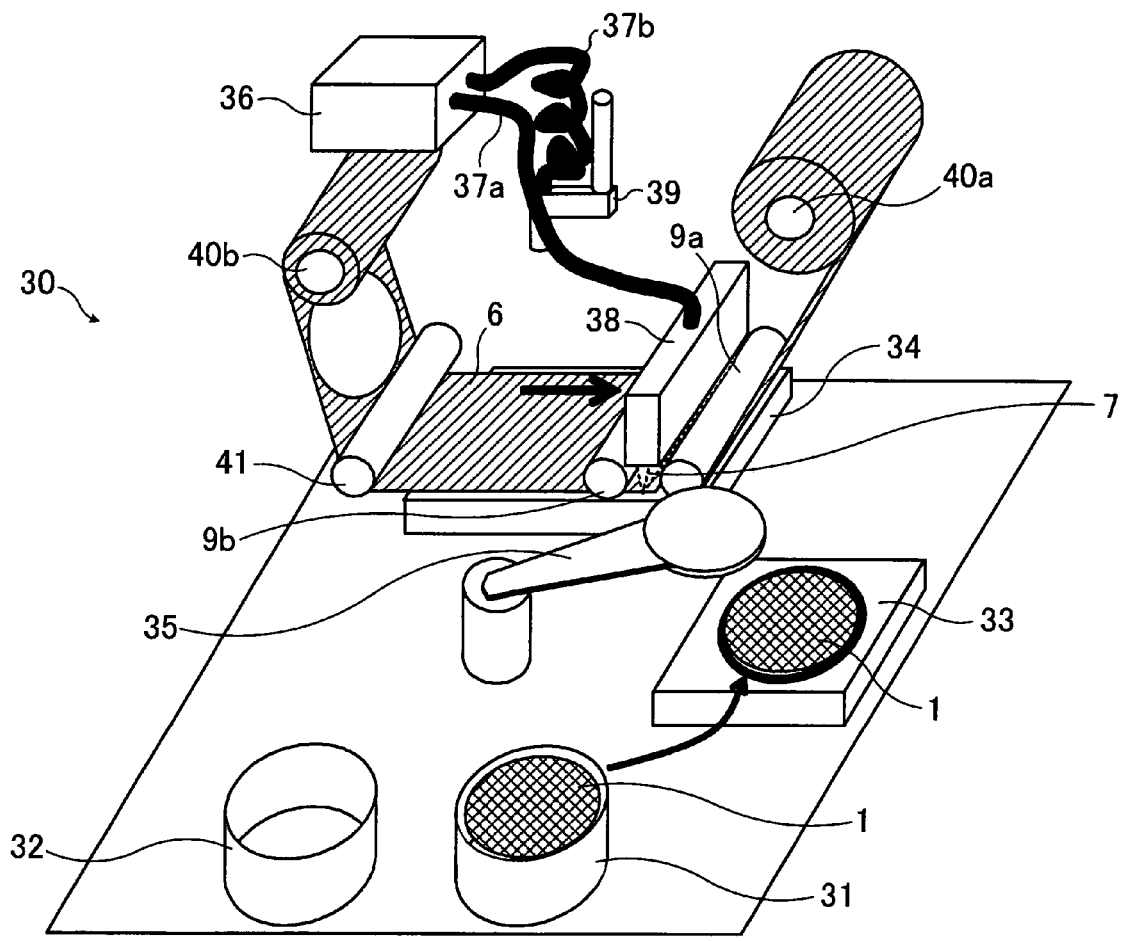
FIG. 14 is a diagram (3) schematically showing the arrangement of the film-bonding apparatus, which is useful in explaining the process step of bonding the die bond film using the film-bonding apparatus.

On the other hand, in the film-bonding table 34, the film-bonding process for bonding the die bond film 6 to the back surface of the to-be-processed wafer 1 is carried out, as shown in FIG. 14.

The die bond film 6 has a width larger than the maximum diameter (diameter) of the wafer 1.

In the film-bonding process, the wafer 1 and the die bond film 6 are bonded to each other in a manner such that the center of the wafer 1 and the center of the die bond film 6 in the direction of width thereof are aligned with each other.

When the die bond film 6 is bonded, the film-setting roller 9a moves toward the film feed roller 40a, and the film-bonding laser irradiation device 38 and the film-bonding roller 9b move in a manner following the film-setting roller 9a.

As a result, while being pressed against the wafer 1 by the moving film-setting roller 9a, the die bond film 6 is irradiated with the laser beam 7 emitted from the film-bonding laser irradiation device 38 moving after the film-setting roller 9a. The irradiated portion of the die bond film 6 is melted, and pressed against the wafer 1 by the film-bonding roller 9b moving after the film-bonding laser irradiation device 38, whereby the die bond film 6 is bonded to the wafer 1.

During execution of the above film-bonding process, as shown in FIG. 14, the wafer transfer robot 35 takes out a next wafer 1 to be processed, from the first wafer case 31, and transfers it to the wafer-centering device 33. The wafer-centering device 33 performs the centering process on the transferred wafer 1.

During operation of the wafer-centering device 33, the wafer transfer robot 35 waits in the vicinity of the film-bonding table 34 so as to transfer the wafer on the film-bonding table 34 after the die bond film 6 is bonded.

Figure 15:
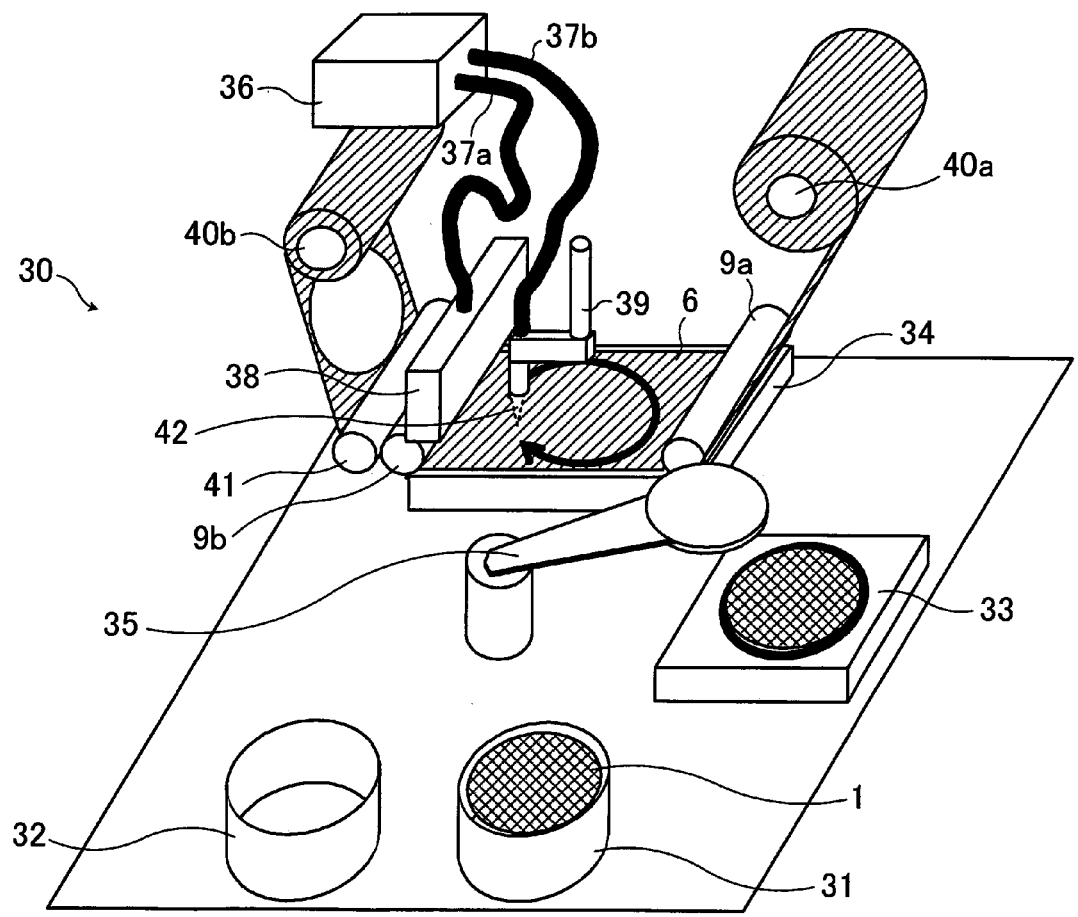
FIG. 15 is a diagram (4) schematically showing the arrangement of the film-bonding apparatus, which is useful in explaining the process step of bonding the die bond film using the film-bonding apparatus.
Figure 16:
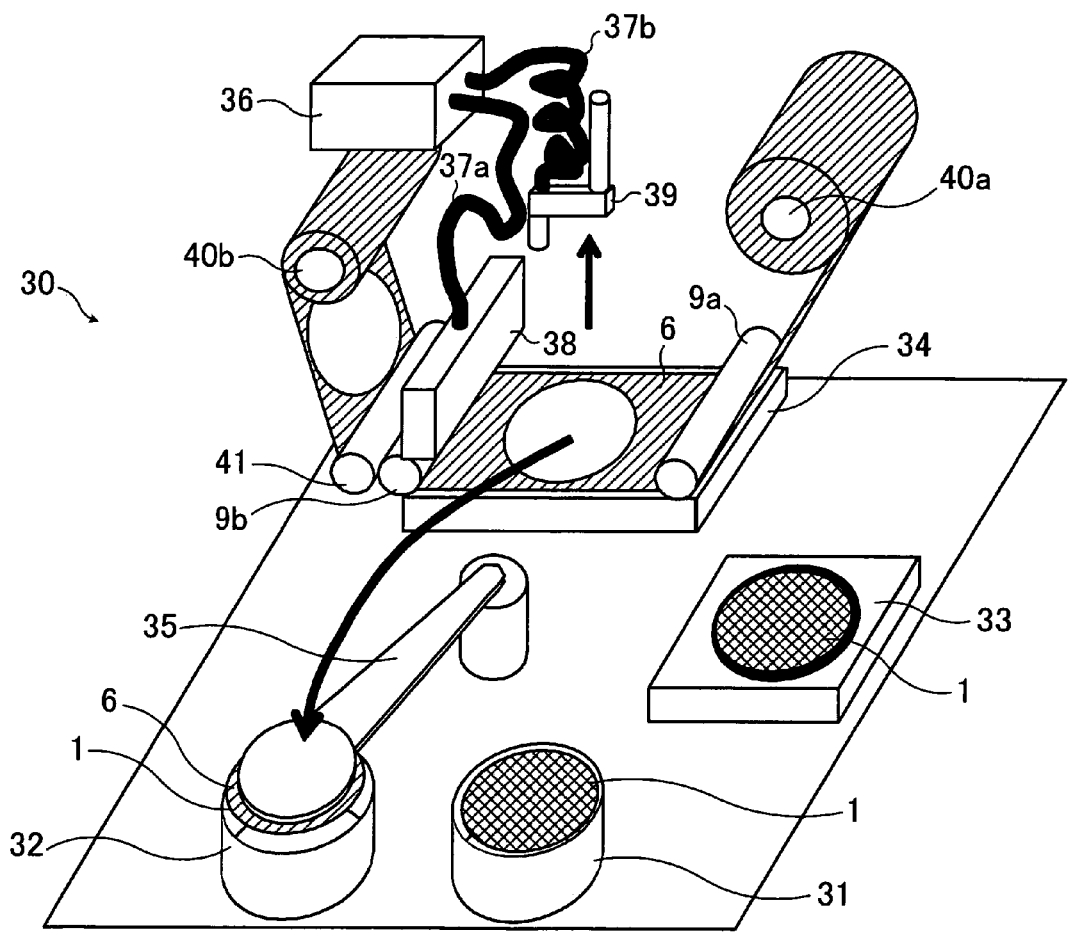
FIG. 16 is a diagram (5) schematically showing the arrangement of the film-bonding apparatus, which is useful in explaining the process step of bonding the die bond film using the film-bonding apparatus.

After bonding the die bond film 6 onto the whole back surface of the wafer 1, the film-bonding roller 9b and the film-bonding laser irradiation device 38 are moved for retraction toward the film-fixing roller 41 as shown in FIG. 15.

In the above state, the laser beam 42 is irradiated from the film-cutting laser irradiation device 39 along the outer shape of the wafer 1 having the die bond film 6 bonded thereto, and the die bond film 6 is cut off along the outer shape of the wafer 1, whereby the die bond film 6 bonded to the back surface of the wafer 1 is separated from the belt-like portion thereof.

Subsequently, after the film-cutting laser irradiation device 39 is retracted to its initial position, the wafer transfer robot 35 transfers the wafer 1 on the film-bonding table 34, that is, the wafer 1 having the die bond film 6 bonded thereto, to the second wafer case 32.

Then, the film-setting roller 9a moves toward the film-fixing roller 41 to return to its initial position, and when the die bond film 6 is taken up from the film feed roller 40a to the film-winding roller 40b, the film-bonding apparatus 30 is placed in a state shown in FIG. 12, which makes it possible to transfer the next wafer 1 subjected to the centering process by the wafer-centering device 33.

Hereinafter, the above-described process is repeatedly carried out up to the number of times corresponding to the number of wafers 1 to be processed.

As described hereinbefore, in the first embodiment, the die bond film 6 is pressed against the wafer 1 by the film-setting roller 9a and the film-bonding roller 9b, and the laser beam 7 is irradiated to the area between the film-setting roller 9a and the film-bonding roller 9b.

Then, the laser beam 7 is moved in accordance with the motion of the film-setting roller 9a, and further the film-bonding roller 9b is moved in a manner following the film-setting roller 9a and the laser beam 7, whereby a melted portion of the die bond film 6 irradiated with the laser beam 7 is pressed against the wafer 1 by the film-bonding roller 9b, to thereby bond the die bond film 6 to the wafer 1.

This makes it possible to uniformly bond the die bond film 6 to the wafer 1, while avoiding occurrence of thermal expansion or thermal contraction of the surface protective tape 2, which is caused e.g. when heating the whole surface of the wafer 1 with a heater or the like.

Next, a description will be given of a second embodiment of the present invention.

Figure 17:
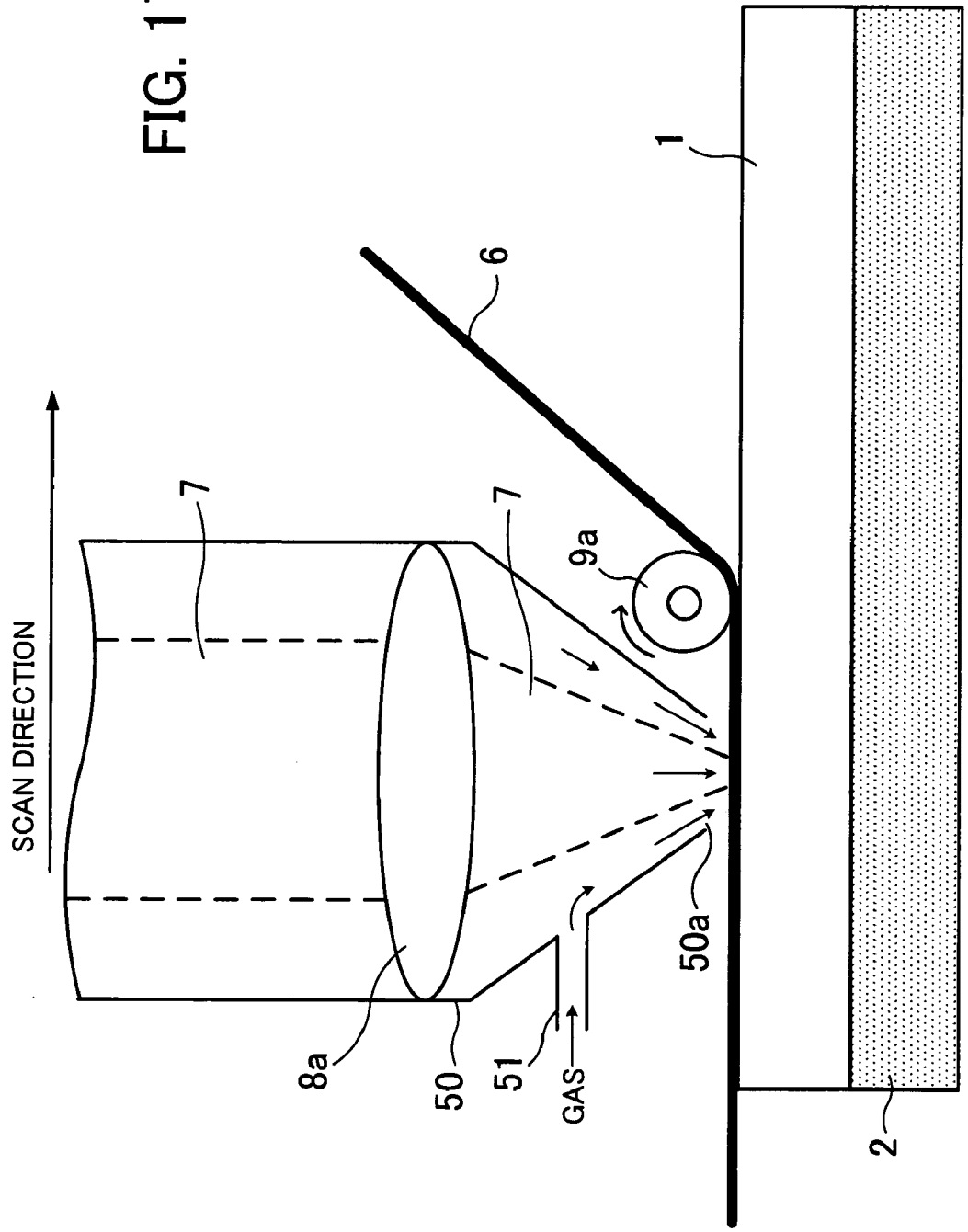
FIG. 17 is a diagram illustrating a method of bonding a die bond film, according to a second embodiment of the present invention.

FIG. 17 illustrates a method of bonding a die bond film, according to the second embodiment.

It should be noted that in FIG. 17, component elements identical to those shown in FIG. 8 are designated by identical reference numerals, and detailed description thereof is omitted.

In the method of bonding the die bond film 6 according to the present embodiment, a portion of the die bond film 6, irradiated with the laser beam, is pressed against the wafer 1 by blowing a gas to the irradiated portion of the die bond film 6.

More specifically, the laser beam 7 is adjusted by the predetermined lens 8a to have a predetermined shape for irradiation to the die bond film 6. The lens 8a is held by a nozzle 50 having an opening 50a configured according to the shape of the laser beam 7.

In the present embodiment, a gas guide hole 51 is disposed in the nozzle 50 such that a gas is supplied under pressure from the gas guide hole 51 and is blown to an irradiated portion of the die bond film 6 from the tip of the nozzle 50.

Thus, in bonding the die bond film 6 to the back surface of the wafer 7 which has the surface protective tape 2 bonded thereto and has been subjected to the back grinding process, the die bond film 6 is pressed against the back surface of the wafer 1 by the film-setting roller 9a moving in the scanning direction of the laser beam 7. The laser beam 7 is irradiated to an area located immediately after the film-setting roller 9a, and a jet of gas (nitrogen gas, or a mixture of nitrogen and oxygen) is issued onto the irradiated area from the nozzle 50.

More specifically, the die bond film 6 is pressed against the back surface of the wafer 1 by the gas blown from the nozzle 50, while being melted by the irradiation of the laser beam 7, whereby the die bond film 6 is bonded to the back surface of the wafer 1.

Also by the aforementioned method of bonding the die bond film 6, similarly to the first embodiment, it is possible to uniformly bond the die bond film 6 to the back surface of the wafer 1, while avoiding occurrence of thermal expansion or the like of the surface protective tape 2.

It should be noted that the above laser beam irradiating/pressing method according to the second embodiment can be applied to the scanning method of the laser beam 7 employed by the film-bonding apparatus 30, and the laser optical system 20, described above in the first embodiment.

More specifically, it is possible to change the die bond film-bonding mechanism which uses the film-setting roller 9a, the film-bonding roller 9b, and the film-bonding laser irradiation device 38 of the film-bonding apparatus 30 according to the first embodiment, to a die bond film-bonding mechanism making use of the second embodiment shown in FIG. 17, to thereby form a film-bonding apparatus.

At this time, as to the processes (for taking out the wafer 1, transfer, storing, and so forth) other than the film-bonding process for bonding the die bond film 6 to the back surface of the wafer 1, it is possible to carry out the same operations as carried out by the film-bonding apparatus 30.

It should be noted that in the second embodiment, a gas is blown onto a portion irradiated with the laser beam from the nozzle 50, and therefore, in setting conditions for irradiation of the laser beam 7, it is necessary to configure the conditions by taking into account not only the material of the die bond film 6 but also a decrease in the temperature of the die bond film 6 caused by the blow of the gas.

Next, a description will be given of a third embodiment of the present invention.

Figure 18:
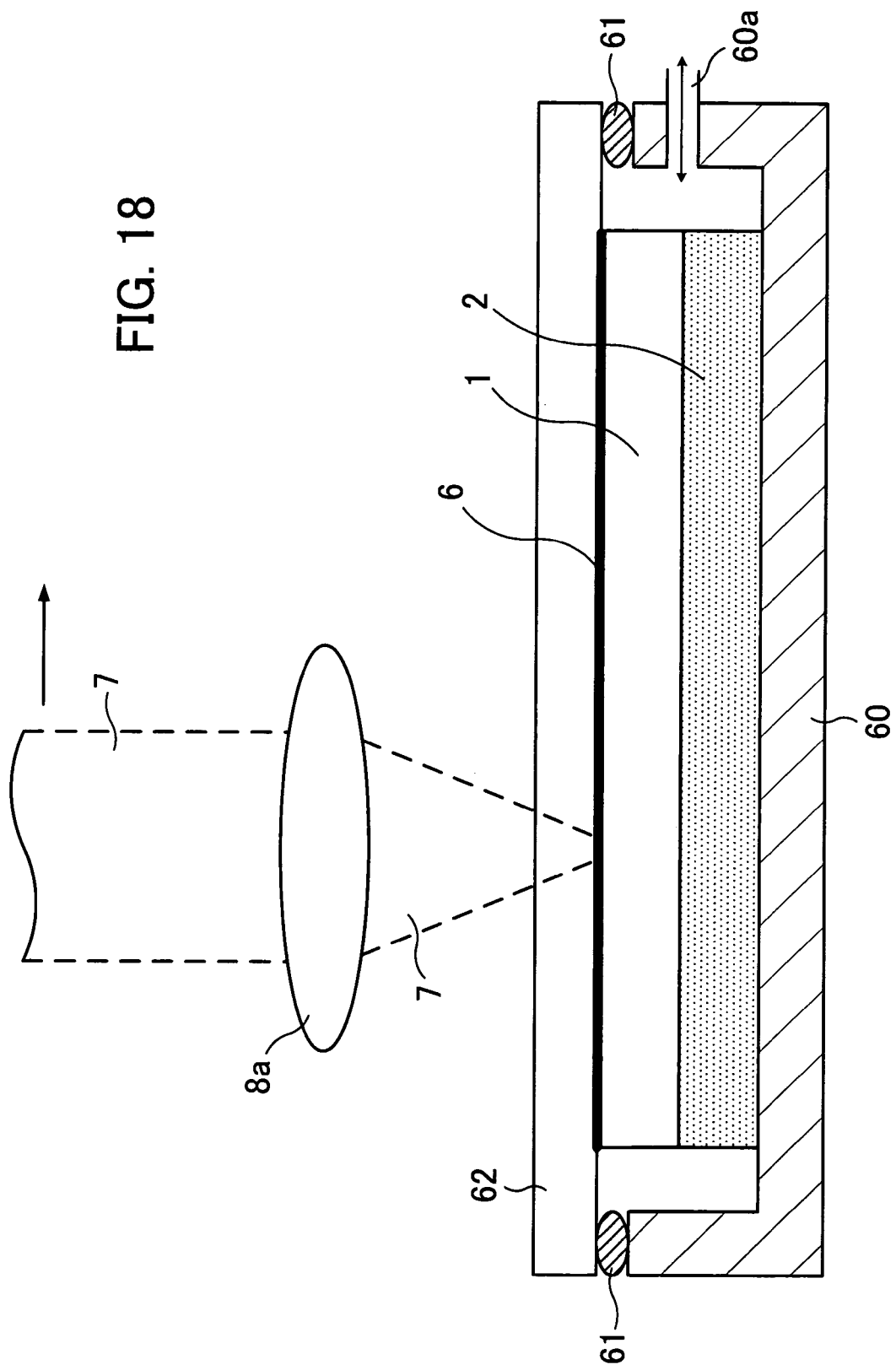
FIG. 18 is a diagram illustrating a method of bonding a die bond film, according to a third embodiment of the present invention.

FIG. 18 shows a method of bonding a die bond film according to the third embodiment.

It should be noted that in FIG. 18, component elements identical to those shown in FIG. 8 are designated by identical reference numerals, and detailed description thereof is omitted.

In the method of bonding the die bond film 6 according to the present embodiment, a portion of the die bond film 6, irradiated with the laser beam, is pressed against the wafer 1 using a light-transmitting plane plate, such as a glass plate.

More specifically, as shown in FIG. 18, the to-be-processed wafer 1 having the surface protective tape 2 bonded to a front surface thereof is stored in a container 60 with the surface protective tape side facing downward, and the die bond film 6 is placed on the back surface of the wafer 1.

In the above state, a glass plate 62 is placed on the container 60 via a packing 61 made e.g. of acrylonitrile butadiene rubber (NBR).

It should be noted that the container 60 includes an exhaust/introduction line 60a for use in depressurization or pressure restoration of the inside thereof in a state in which the glass plate 62 is placed on the container 60 via the packing 61.

The container 60 is set to have a depth which makes it possible for the glass plate 62 to press the die bond film 6 against the wafer 1 when the glass plate 62 is pulled by drawing the gas from the container 60 through the exhaust/introduction line 60a in a state where the container 60 is sealed by the glass plate 62 via the packing 61.

After that, the gas within the container 60 is exhausted for decompression through the exhaust/introduction line 60a, and the inside of the container 60 is held in a low-pressure atmosphere. By the decompression process, the glass plate 62 is attracted toward the container 60, whereby the die bond film 6 is pressed against the back surface of the wafer 1.

In the above state, the laser beam 7 formed into a predetermined shape via the lens 8a is irradiated onto the die bond film 6 by transmission through the glass plate 62. As a result, an irradiated portion of the die bond film 6 is heated and melted, and at this time, being pressed by the glass plate 62, whereby the die bond film 6 is bonded to the back surface of the wafer 1.

At this time, the laser beam 7 formed into a rectangular shape for irradiation is scanned from one edge, through the center, to the other edge of the wafer 1 by the scanning method and the laser optical system 20, according to the first embodiment.

After the die bond film 6 is bonded to the back surface of the wafer 1 as described above, the exhaustion through the exhaust/introduction line 60a is stopped, and a predetermined gas pressure is restored, whereafter the glass plate 62 is removed, and the wafer 1 having the die bond film 6 bonded thereto is taken out.

When the above film-bonding process continues to be performed, a next wafer 1 to be processed is received in the container 60, and the die bond film 6 is bonded by the same procedure.

Also by the aforementioned method of bonding the die bond film 6, similarly to the first embodiment, it is possible to uniformly bond the die bond film 6 to the back surface of the wafer 1, while avoiding occurrence of thermal expansion or the like of the surface protective tape 2.

Next, a description will be given of a fourth embodiment according to the invention.

Although in the first to third embodiments, descriptions have been given of the cases in which the laser beam 7 formed into a rectangular shape that is thin and longer than the diameter of the wafer 1 is scanned on the wafer 1, whereby the laser beam 7 is eventually irradiated onto the whole back surface of the wafer 1, the shape and/or the scanning methods of the laser beam 7 are by no means limited to any specific ones of the above-described embodiments.

Figure 19:
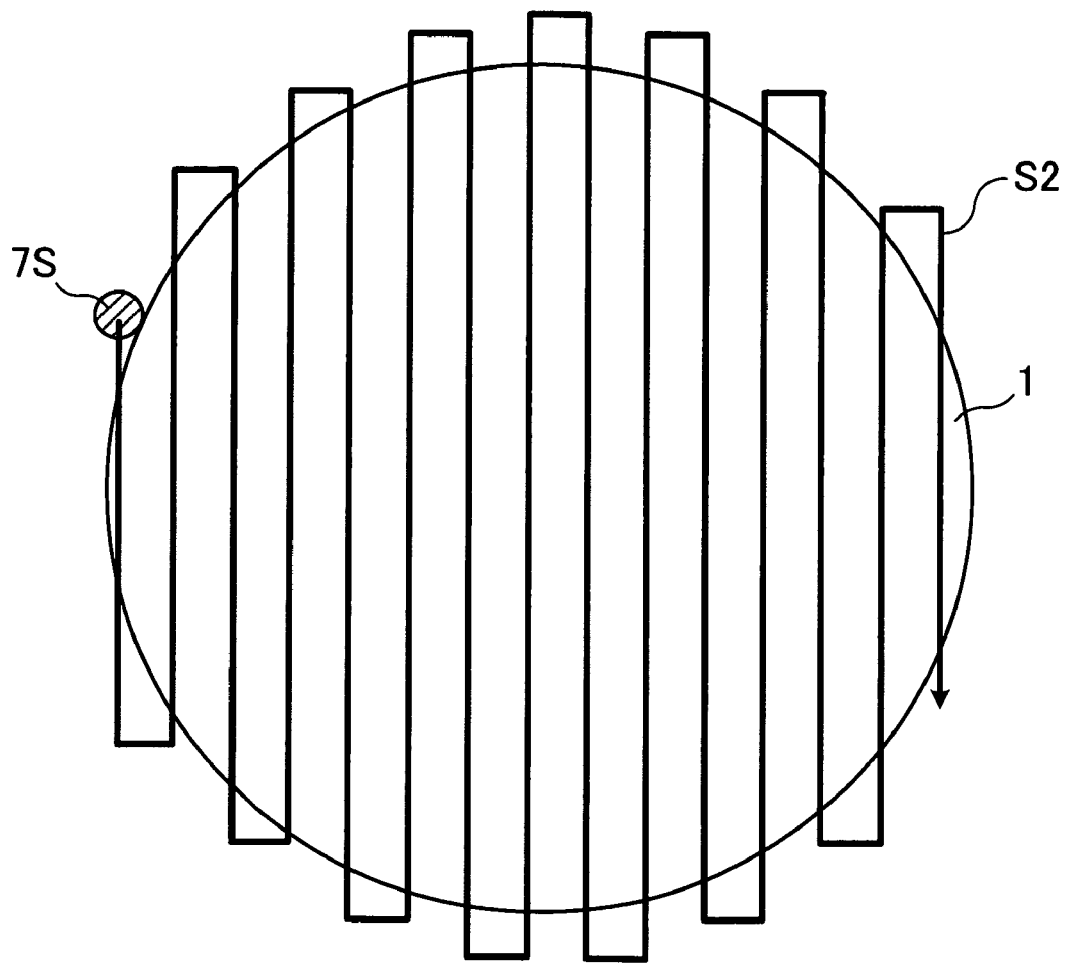
FIG. 19 is a diagram showing a variation of the laser scanning method.
Figure 20:
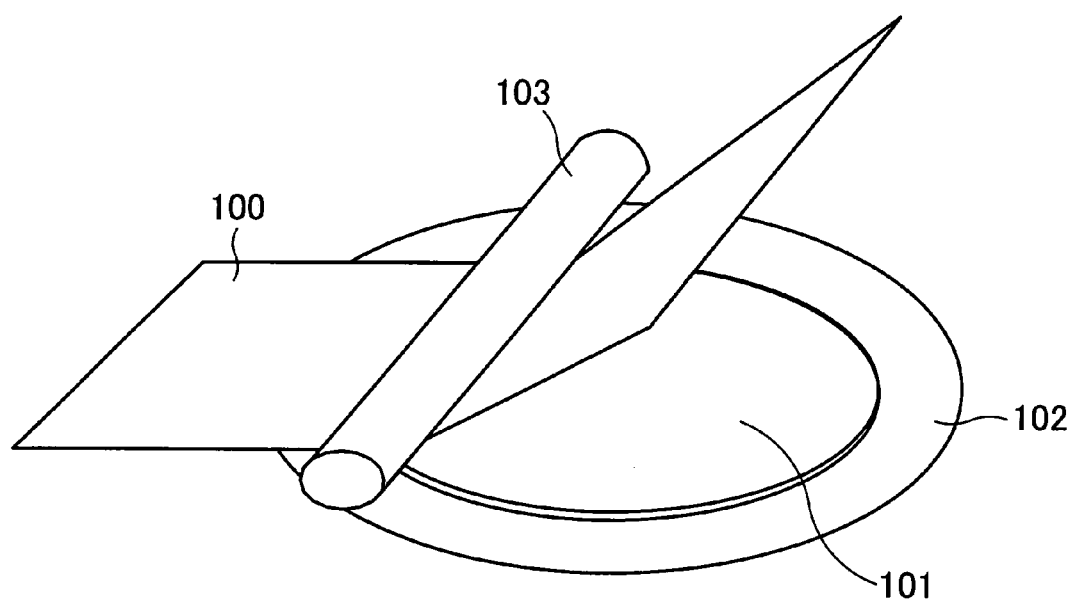
FIG. 20 is a diagram showing a conventional method of bonding a thermoplastic die bond film to a wafer.

FIG. 19 shows a variation of the moving (scanning) method of the laser beam (the laser scanning method).

According to the fourth embodiment, the laser beam is formed into a circular or rectangular spot shape, and as indicated by an arrow S2 shown in FIG. 19, it is scanned on the die bond film in a parallel reciprocating fashion or in a zigzag fashion.

Also by the above-described scanning method of scanning the laser beam 7S formed into the pot shape, eventually, the whole back surface of the die bond film on the wafer 1 can be irradiated with the laser beam 7S.

When the laser beam 7S having the spot shape is irradiated as described above, an irradiation area irradiated by the laser beam 7S can be made smaller than an irradiation area irradiated by a laser beam having an elongated rectangular shape as used in the first to third embodiments. Therefore, occurrence of thermal expansion or the like of the surface protective tape 2 can be more effectively avoided.

Although the above scanning method of scanning the laser beam 7S having the spot shape can be applied as it is to the bonding of the die bond film 6 as shown in the first to third embodiments, it is also possible to apply the scanning method to the bonding after modifying e.g. the method of moving the film-setting roller 9a, as required.

Also when the above-described scanning method of scanning the laser beam 7S having the spot shape is employed, it is possible to configure the laser irradiation conditions properly according to the material and the like of the die bond film 6.

It should be noted that also when the laser beam 7S having the spot shape is irradiated as described above, a gas (nitrogen gas, or a mixture of nitrogen and oxygen) is blown before and after the laser beam at least along the direction of motion of the laser beam. More specifically, the die bond film 6 is melted by the irradiation of the laser beam 7S, while being pressed against the back surface of the wafer 1 by the blowing of the gas, whereby the die bond film 6 is bonded to the back surface of the wafer 1.

Similarly to the second embodiment, the gas is blown toward the to-be-processed wafer 1 from a gas-discharging section provided in the outer periphery of a laser beam-irradiating nozzle, or a gas-discharging section provided separately from the laser beam-irradiating nozzle, or alternatively by blowing the gas onto the whole back surface of the wafer 1. The melted portion of the die bond film 6 is pressed against the back surface of the wafer 1 by the blowing gas, and is bonded to the back surface of the wafer 1.

As described above, in the above-descried embodiments of the present invention, the laser beam 7 is applied to bonding of the thermoplastic die bond film 6. The laser beam 7 is irradiated onto the die bond film 6 to selectively melt the same, and the melted die bond film 6 is pressed against the wafer 1, thereby being bonded thereto.

As a result, even when the wafer 1 is processed to be thin and have a reduced strength, it is possible to avoid the wafer 1 from being damaged when the die bond film 6 is bonded to the wafer 1, thereby making it possible to manufacture the semiconductor device with higher yields.

It should be noted that although in the above descriptions, the die bond film 6 is bonded to the wafer 1, by way of example, this is not limitative, but the present invention can be applied not only to bonding of the die bond film 6 to the wafer 1 but also to bonding of various types of films to the wafer 1 similarly. Further, the present invention can be applied not only to bonding of films to the wafer 1 but also to bonding of films to various types of substrates similarly.

According to the present invention, when a film being heated is bonded to one main surface of a thinned substrate (wafer), the film can be bonded to the wafer without being influenced by thermal deformation of a surface protective tape bonded to the other main surface of the wafer in advance.

Therefore, it is possible to enhance the yield of manufacturing semiconductor devices without causing any crack or breakage of thinned wafers.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A film bonding method comprising:
   disposing a film on one surface of a substrate;
   selectively irradiating a laser beam onto the film to thereby selectively melt the film; and
   pressing a portion of the film in a melted state against the substrate to thereby bond the film to the one surface of the substrate; wherein:
   the film disposed on the substrate is larger than the substrate;
   the selectively irradiating the laser beam includes scanning the film with the laser beam having a cross section wider than the substrate; and
   the film is directly bonded to a whole of the one surface of the substrate by the scanning.

2. The film bonding method according to claim 1, wherein the substrate is a semiconductor substrate.

3. The film bonding method according to claim 1, wherein the pressing the portion of the film in the melted state against the substrate includes blowing a gas onto the portion of the film in the melted state.

4. The film bonding method according to claim 1, wherein the pressing the portion of the film in the melted state against the substrate includes pressing the portion of the film in the melted state against the substrate using a roller.

5. The film bonding method according to claim 1, wherein the pressing the portion of the film in the melted state against the substrate includes pressing the portion of the film in the melted state against the substrate using a glass plate.

\* \* \* \* \*